United States Patent
Shih et al.

(10) Patent No.: US 11,031,303 B1
(45) Date of Patent: Jun. 8, 2021

(54) DEEP TRENCH ISOLATION STRUCTURE AND METHOD OF MAKING THE SAME

(71) Applicant: Taiwan Semiconductor Manufacturing Company Limited, Hsinchu (TW)

(72) Inventors: Hung-Ling Shih, Tainan (TW); Tsung-Yu Yang, Tainan (TW); Yun-Chi Wu, Tainan (TW); Po-Wei Liu, Tainan (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 16/743,300

(22) Filed: Jan. 15, 2020

(51) Int. Cl.
| | | |
|---|---|---|
| *H01L 21/8238* | (2006.01) | |
| *H01L 29/06* | (2006.01) | |
| *H01L 27/06* | (2006.01) | |
| *H01L 21/762* | (2006.01) | |
| *H01L 21/8249* | (2006.01) | |

(52) U.S. Cl.
CPC ........ *H01L 21/823878* (2013.01); *H01L 21/76224* (2013.01); *H01L 21/8249* (2013.01); *H01L 21/823807* (2013.01); *H01L 21/823864* (2013.01); *H01L 27/0623* (2013.01); *H01L 29/0649* (2013.01)

(58) Field of Classification Search
CPC ....... H01L 21/823878; H01L 21/76224; H01L 21/823807; H01L 21/823864; H01L 21/8249; H01L 27/0623; H01L 29/0649
USPC ........ 257/506, 513, 527; 438/207, 218, 294
See application file for complete search history.

(56) References Cited

U.S. PATENT DOCUMENTS

| | | | |
|---|---|---|---|
| 5,914,523 | A | 6/1999 | Bashir et al. |
| 2011/0193193 | A1* | 8/2011 | Dube et al. ....... H01L 29/66181 257/532 |

(Continued)

FOREIGN PATENT DOCUMENTS

| | | |
|---|---|---|
| KR | 19990072686 | 9/1999 |
| KR | 20140008232 | 1/2014 |
| KR | 20180074897 | 7/2018 |

OTHER PUBLICATIONS

Korean Office Action: Application No. 10-2020-0044734, Office Action dated Apr. 19, 2021.

*Primary Examiner* — Thinh T Nguyen
(74) *Attorney, Agent, or Firm* — The Marbury Law Group, PLLC

(57) ABSTRACT

A semiconductor structure can include a high voltage region, a first moat trench isolation structure electrically insulating the high voltage region from low voltage regions of the semiconductor structure, and a second moat trench isolation structure electrically insulating the high voltage region from the low voltage regions of the semiconductor structure. The first moat trench isolation structure can include dielectric sidewall spacers and a conductive fill material portion located between the dielectric sidewall spacers. The second moat trench isolation structure can include only at least one dielectric material, and can include a dielectric moat trench fill structure having a same material composition as the dielectric sidewall spacers and having a lateral thickness that is greater than a lateral thickness of the dielectric sidewall spacers and is less than twice the lateral thickness of the dielectric sidewall spacers.

12 Claims, 8 Drawing Sheets

(56) References Cited

U.S. PATENT DOCUMENTS

2014/0015047 A1   1/2014  Ng et al.
2018/0182747 A1   6/2018  Kim et al.

* cited by examiner

DEEP TRENCH ISOLATION STRUCTURE AND METHOD OF MAKING THE SAME

BACKGROUND

The present disclosure is directed to semiconductor structures, and specifically to a deep trench isolation structures for semiconductor structures and methods of forming the same.

Bipolar/CMOS/DMOS (BCD) devices include a bipolar region to perform analog functions, a complementary metal oxide semiconductor (CMOS) region to perform digital functions and a double diffused metal oxide semiconductor (DMOS) region which include power and high-voltage elements to provide power. BCD devices are used in communications applications such as in smart phones and tablets as well as in automotive application, e.g. for mirror positioning, seat adjustment, etc. By integrating three distinct types of components on a single die, BCD technology may reduce the number of components in the bill of materials (BoM). Fewer chip components in the BoM further reduces the area on the board, thus driving down costs. However, integrating different types of components that operate at different voltages can present challenges in electrical isolation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
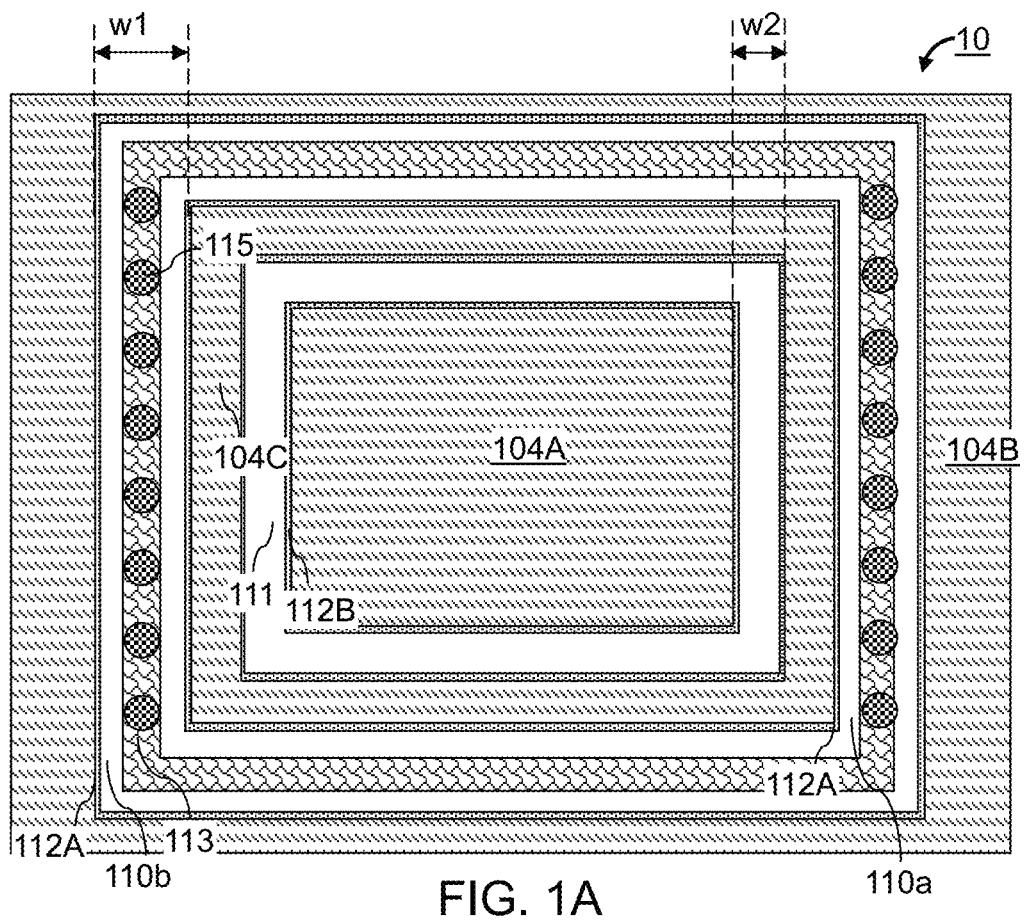
FIG. 1A is a partial see-through top-down view of a first exemplary structure including a dual moat trench isolation structure in accordance with some embodiments. A dielectric material layer and details of semiconductor structures are not illustrated for clarity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

The structures and method of the present disclosure can be used to provide electrical isolation between regions of a semiconductor chip which operate at different voltages. The development of 10 nanometer transistors has led to the breakdown of Moore's law. In response, semiconductor chip designers are focusing their efforts on integrating different types of semiconductor devices on a single chip. For example, a single semiconductor chip, such as a BCD chip, may have an analog region comprising bipolar junction transistors, a digital logic region comprising complementary metal oxide semiconductor (CMOS) transistors and a power region comprising double diffused metal oxide semiconductor (DMOS) transistors. By combining the functionality that had previously been on separate chips into a single integrated chip, the number of chips may be reduced. Consequently, real estate on circuit boards may be freed up as fewer chips may be required. Thus, the cost of assembly may also be lowered.

However, the various semiconductor devices placed in close proximity to one another may utilize different voltages in operation. For example, in some embodiments, the DMOS transistors may have an operating voltage in a range from 50 volts to 1,000 volts. In contrast, the bipolar or CMOS transistor devices may have an operating voltage less than 50 V, and/or less than 24 V, and/or less than 12 V, and/or less than 6 V. By placing the high voltage devices in close proximity to the low voltage devices, significant damage may occur to the low voltage devices. Thus, structures to isolate the high voltage devices from the low voltage devices may be employed to protect the low voltage devices.

Figure 1B:
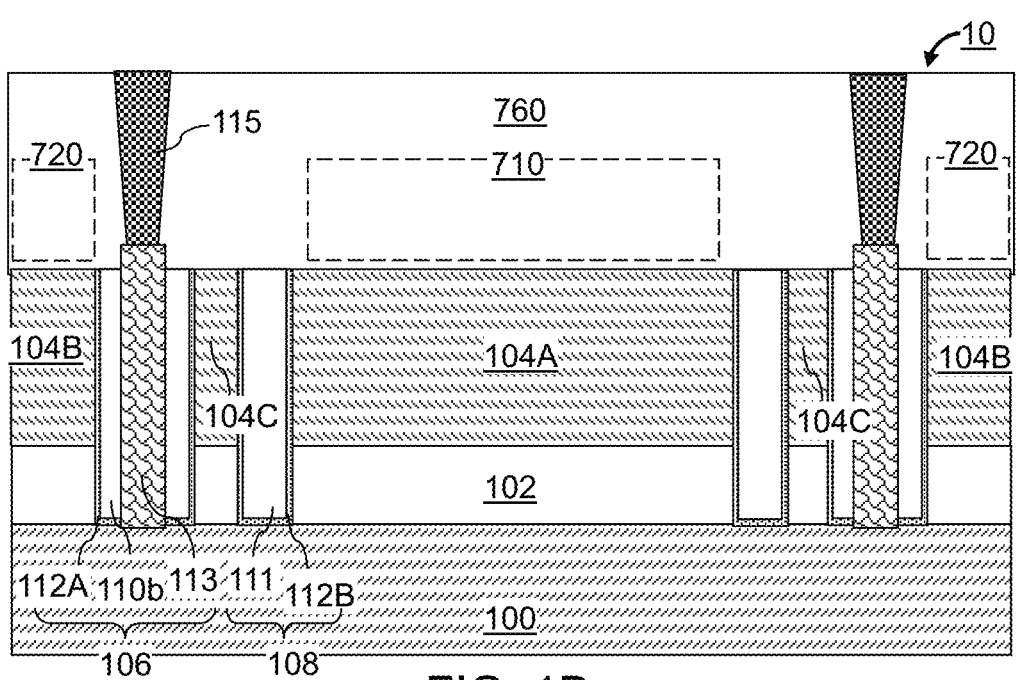
FIG. 1B is a vertical cross-sectional view of the first exemplary structure of FIG. 1A.

With reference to FIGS. 1A and 1B, a first exemplary semiconductor structure 10 including a dual moat trench isolation structure in accordance with some embodiments is disclosed. In an embodiment, the first exemplary structure includes a handle substrate 100, a buried insulator layer 102 and a semiconductor device layer including various semiconductor substrate material portions (104A, 104B, 104C). At least two nested moat trenches may be formed to laterally divide the various semiconductor substrate material portions (104A, 104B, 104C). The at least two nested moat trenches include a first moat trench located on the outside and a second moat trench located on the inside. In one embodiment, the first moat trench may have a first width w1, and the second moat trench can have a second width w2. The first width w1 may be greater than the second width w2. In one embodiment, the first width w1 may be greater than twice the second width w2.

The various semiconductor substrate material portions (104A, 104B, 104C) may include a first semiconductor substrate material portion 104A that is laterally surrounded by the second moat trench, a second semiconductor substrate material portion 104B that is located outside the first moat trench, and a third semiconductor substrate material portion 104C that is located between the first moat trench and the second moat trench. Each of the first moat trench and the second moat trench may have any annular shape such as a rectangular annular shape, a rounded rectangular annular shape, a circular annular shape, an elliptical annular shape, or any two-dimensional annular shape when viewed from the top-down. The buried insulator layer 102 may include an insulator material such as silicon oxide, silicon nitride, or aluminum oxide. Other suitable materials within the contemplated scope of disclosure may also be used. The stack of the handle substrate 100, the buried insulator layer 102, and the semiconductor substrate material portions (104A, 104B, 104C) may be provided as a silicon-on-insulator substrate. The buried insulator layer 102 can have a thickness in a range from 50 nm to 500 nm, although lesser and greater thicknesses can also be used.

The region including the first semiconductor substrate material portion 104A can be used as a high voltage region of a semiconductor chip 10. The first semiconductor substrate material portion 104A may be laterally surrounded by a first moat trench isolation structure 106 that fills the first moat trench and by a second moat trench isolation structure 108 that fills the second moat trench. In an embodiment, the second moat trench isolation structure 108 may have a second width w2 that is less than half the first width w1 of the first moat trench isolation structure 106.

In an embodiment, the first moat trench isolation structure 106 may include dielectric sidewall spacers 110 of an insulating material. The dielectric sidewall spacers 110 may include an inner dielectric sidewall spacer 110a that is laterally surrounded by a conductive moat fill material portion 113, and an outer dielectric sidewall spacer 110b that laterally surrounds the conductive moat fill material portion 113. Suitable insulating material include, but are not limited to silicon oxide. Other suitable materials within the contemplated scope of disclosure may also be used. The outer dielectric sidewall spacer 110b and the inner dielectric spacer 110a can have a same lateral width. Located between the dielectric sidewall spacers 110 of insulating material in the first deep trench isolation trench 106 is the conductive moat fill material portion 113. Each of the outer dielectric sidewall spacer 110b, the inner dielectric spacer 110a, and the conductive fill structure 113 can be topologically isomorphic to a torus, i.e., has a respective shape that may be deformed into a torus without forming or destroying a hole in any surface thereof.

In one embodiment, the second moat trench isolation structure 108 includes a dielectric moat trench fill structure 111. The dielectric moat trench fill structure 111 may include the same material as the outer dielectric sidewall spacer 110b and the inner dielectric spacer 110a. According to an embodiment of the present disclosure, the second moat trench isolation structure 108 can have a lateral width that is greater than the lateral width of each of the outer dielectric sidewall spacer 110b and the inner dielectric spacer 110a, and may be less than twice the lateral width of each of the outer dielectric sidewall spacer 110b and the inner dielectric spacer 110a. In one embodiment, the dielectric moat trench fill structure 111, the outer dielectric sidewall spacer 110b, and the inner dielectric spacer 110a can consist essentially of silicon oxide. The lateral thickness of the outer dielectric sidewall spacer 110b and the inner dielectric spacer 110a may be in a range from 50 nm to 300 nm, although lesser and greater thicknesses can also be used.

In an embodiment, a first diffusion barrier layer 112A may be optionally provided between each insulating dielectric sidewall spacer 110a, 110b and sidewalls of the second semiconductor substrate material portion 104B and the third semiconductor substrate material portion 104C. The optional first diffusion barrier layers 112A may be formed by conformally depositing a dielectric diffusion barrier material such as silicon nitride in the first moat trench and the second moat trench prior to depositing the insulating material of the dielectric sidewall spacers 110a, 110b.

If the first diffusion barrier layers 112A are provided in the first deep trench isolation moat structure 106, a second diffusion barrier layer 112B may be provided in the second deep trench as a component of the second moat trench isolation structure 108. The second diffusion barrier layer 112B can be a continuous material layer having the same material composition and the same thickness as the first diffusion barrier layers 112A. The first diffusion barrier material layers 112A and the second diffusion barrier material layer 112B includes a diffusion-blocking dielectric material such as silicon nitride, and may have a thickness in a range from 4 nm to 30 nm, although lesser and greater thicknesses can also be employed.

First semiconductor devices 710 can be formed on, and/or within portions of, the first semiconductor substrate material portion 104A. Second semiconductor devices 720 can be formed on, and/or within portions of, the second semiconductor substrate material portion 104B. In one embodiment, the first semiconductor devices 710 comprise at least one bipolar-CMOS-DMOS (BCD) device. In one embodiment, at least one of the first semiconductor devices 710 can have an operating voltage in a range from 50 volts to 1,000 volts. The region of the first semiconductor devices 710 can be a high voltage region, which can include a power region containing power semiconductor devices. The region of the second semiconductor devices 720 can be a low voltage region comprising a digital region and an analog region. In one embodiment, all of the second semiconductor devices 720 can have an operating voltage less than 50 V, and/or less than 24 V, and/or less than 12 V, and/or less than 6 V.

A contact-level dielectric layer 760 can be formed over the first semiconductor devices 710 and the second semiconductor devices 720. Contact via structures 115 may be formed through the contact-level dielectric layer 760 contacting the top surface of the conductive moat fill material portion 113 in the first moat trench isolation structure 106.

Figure 2A:
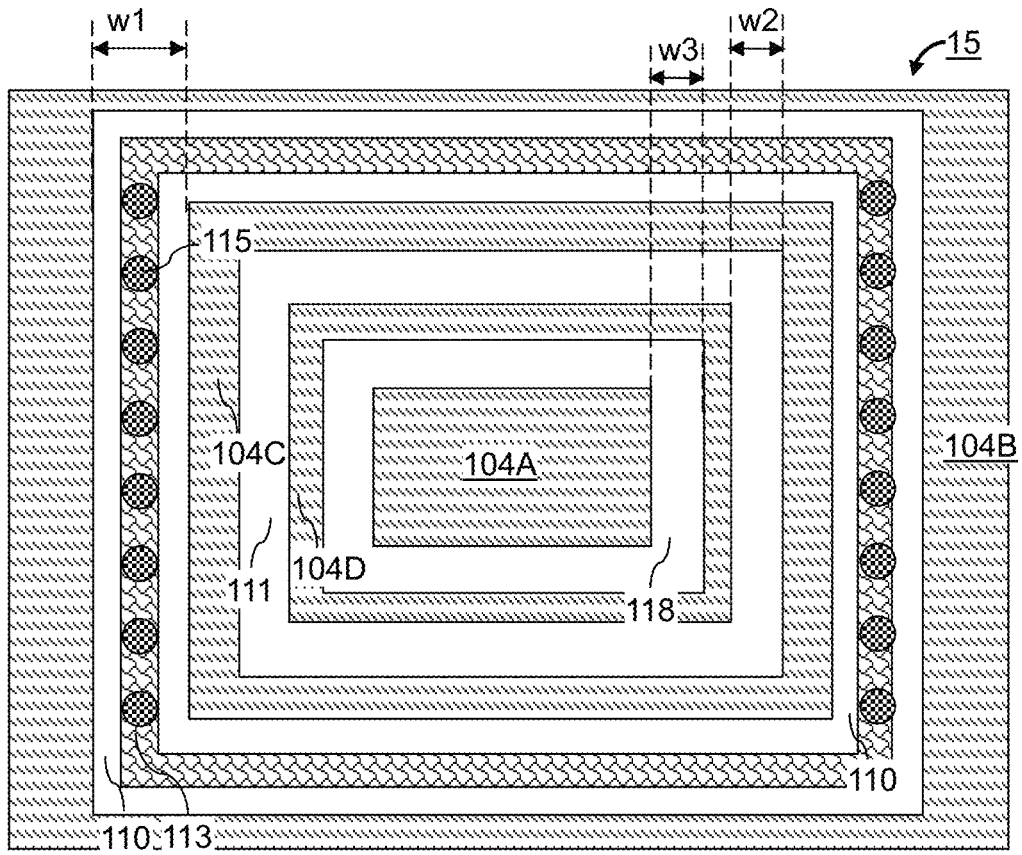
FIG. 2A is a partial see-through top-down view of a second exemplary structure including a triple moat trench isolation structure in accordance with some embodiments. A dielectric material layer and details of semiconductor structures are not illustrated for clarity.
Figure 2B:
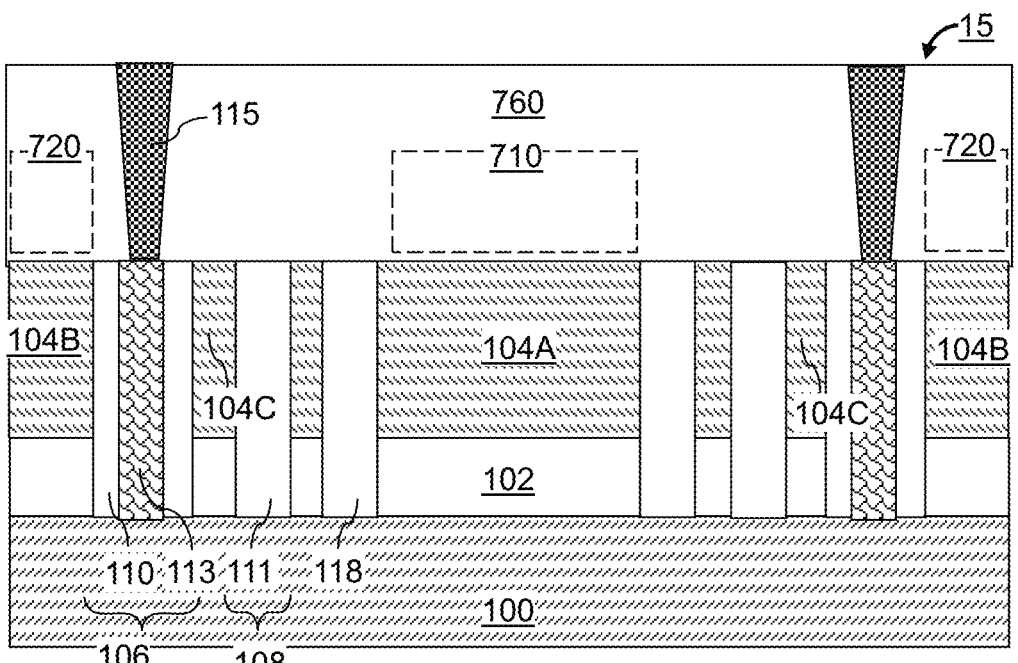
FIG. 2B is a vertical cross-sectional view of the first exemplary structure of FIG. 2A.

With reference to FIGS. 2A and 2B, a second exemplary semiconductor structure 15 including a triple moat trench isolation structure in accordance with some embodiments is disclosed. While the second exemplary structure illustrates an embodiment in which the diffusion barrier layers (112A, 112B) are not used, embodiments are expressly contemplated herein in which the diffusion barrier layers (112A, 112B) are used in conjunction with the variations in the second exemplary structure with respect to the first exemplary structure.

As in the first exemplary semiconductor structure 10, the second exemplary semiconductor structure 15 includes a first moat trench isolation structure 106 and a second moat trench isolation structure 108 that electrically isolate a high voltage region from lower voltage regions of the semiconductor chip. However, in this embodiment, a third moat trench isolation structure 118 is additionally provided inside the second moat trench isolation structure 108. Similar to the second moat trench isolation structure 108, the third moat trench isolation structure 118 has a third width w3 that may be less than half the first width w1 of the first moat trench isolation structure 106. The third width w3 of the third moat trench isolation structure 118 may be same as the second width w2 of the second moat trench isolation structure 108, or may be different, i.e. larger or smaller. Put another way, a width of the first moat trench isolation structure 106 may be at least twice a width of the second (108) and/or third (118) of the at least two moat trench isolation structures. The addition of the third moat trench isolation structure 118 provides additional electrical isolation relative to the embodiment illustrated in FIGS. 1A and 1B. In an aspect of this embodiment, further additional moat trench isolation structures may be provided as desired.

Figure 3:
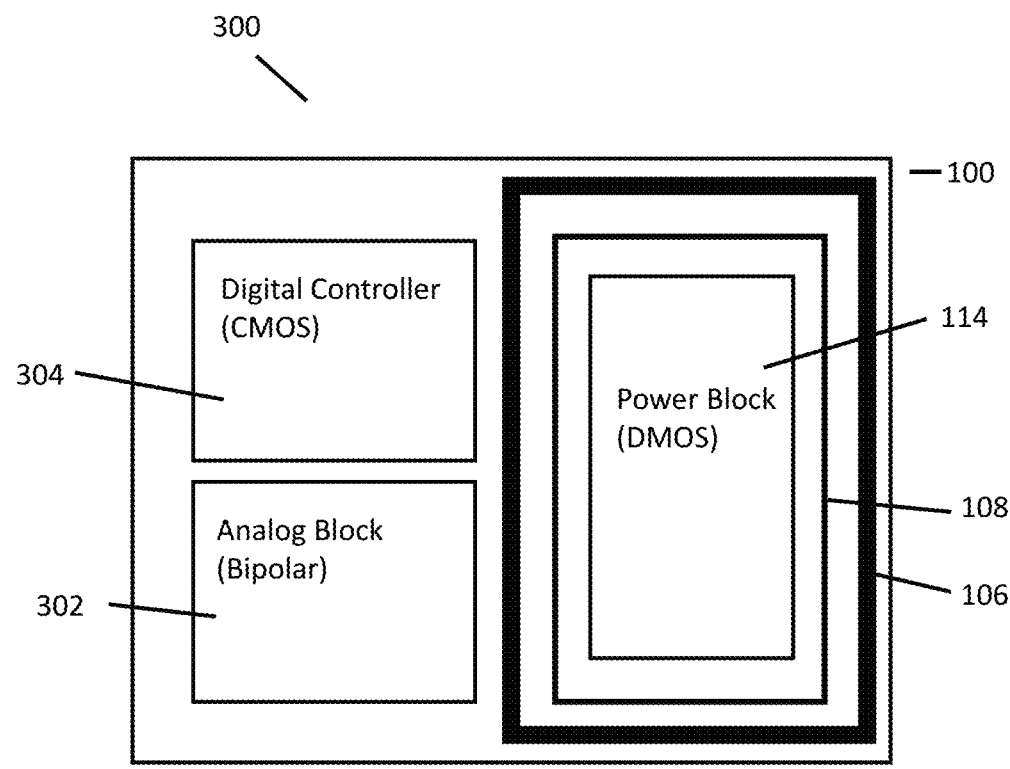
FIG. 3 is a plan view of a semiconductor structure comprising a deep trench isolation structure in accordance with some embodiments.

FIG. 3 illustrates an embodiment of a semiconductor structure 300, such as a BCD device, comprising a deep trench isolation structure in accordance with some embodiments. The semiconductor structure 300 may have at least one high voltage region 114 and at least one lower voltage region 302, 304. The high voltage region 114 may contain devices that operate at voltages greater than 10V, such as greater than 50V, such as greater than 100V, such as greater than 200V. The lower voltage regions 302, 304 have devices that operate at voltages less then 10V. In an embodiment, the semiconductor structure 300 includes a low voltage analog region 302 which typically comprises bipolar junction transistors and a low voltage digital region 304 which comprises CMOS field effect transistors. The high voltage region may include DMOS field effect transistors designed to distribute power to other regions of the chip. Surrounding the high voltage region are two moat trench isolation structures 106, 108 which electrically isolate the low voltage analog region 302 and the low voltage digital region 304 from the high voltage region.

Figure 4:
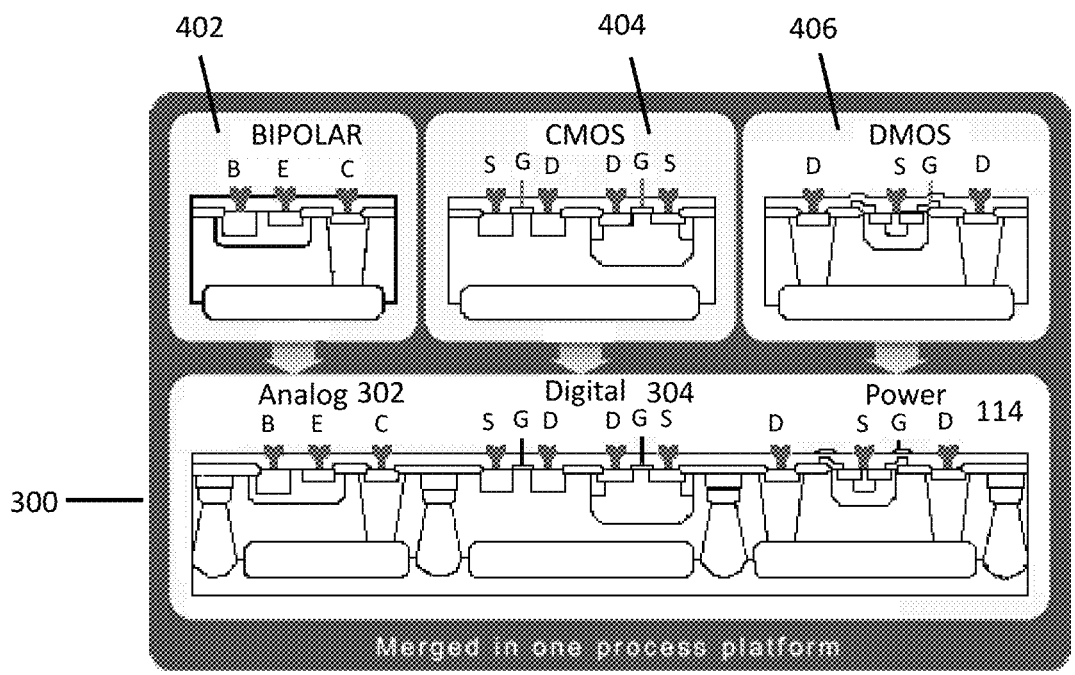
FIG. 4 is a schematic illustration of the structure of FIG. 3.

FIG. 4 is a schematic illustration of a semiconductor structure 300 according to FIG. 3 with more details. The top portion of FIG. 4 illustrates a separate bipolar analog device 402, a separate digital CMOS device 404 and a separate high voltage DMOS device 406. As illustrated in the bottom portion of FIG. 4, the separate bipolar analog device 402, digital CMOS device 404 and high voltage DMOS device 406 may be integrated into a single chip having a low voltage analog region 302, a low voltage digital region 304 and a high voltage region. As discuss above, the low voltage analog region 302 may comprise bipolar junction transistors having a base B, an emitter E and a collector C. The low voltage digital region 304 may comprise pnp-npn complementary metal oxide semiconductor transistors having sources S, drains D and gates G. The high voltage region may include double diffused metal oxide semiconductor transistors having sources S, drains D and gates G.

Figure 5:
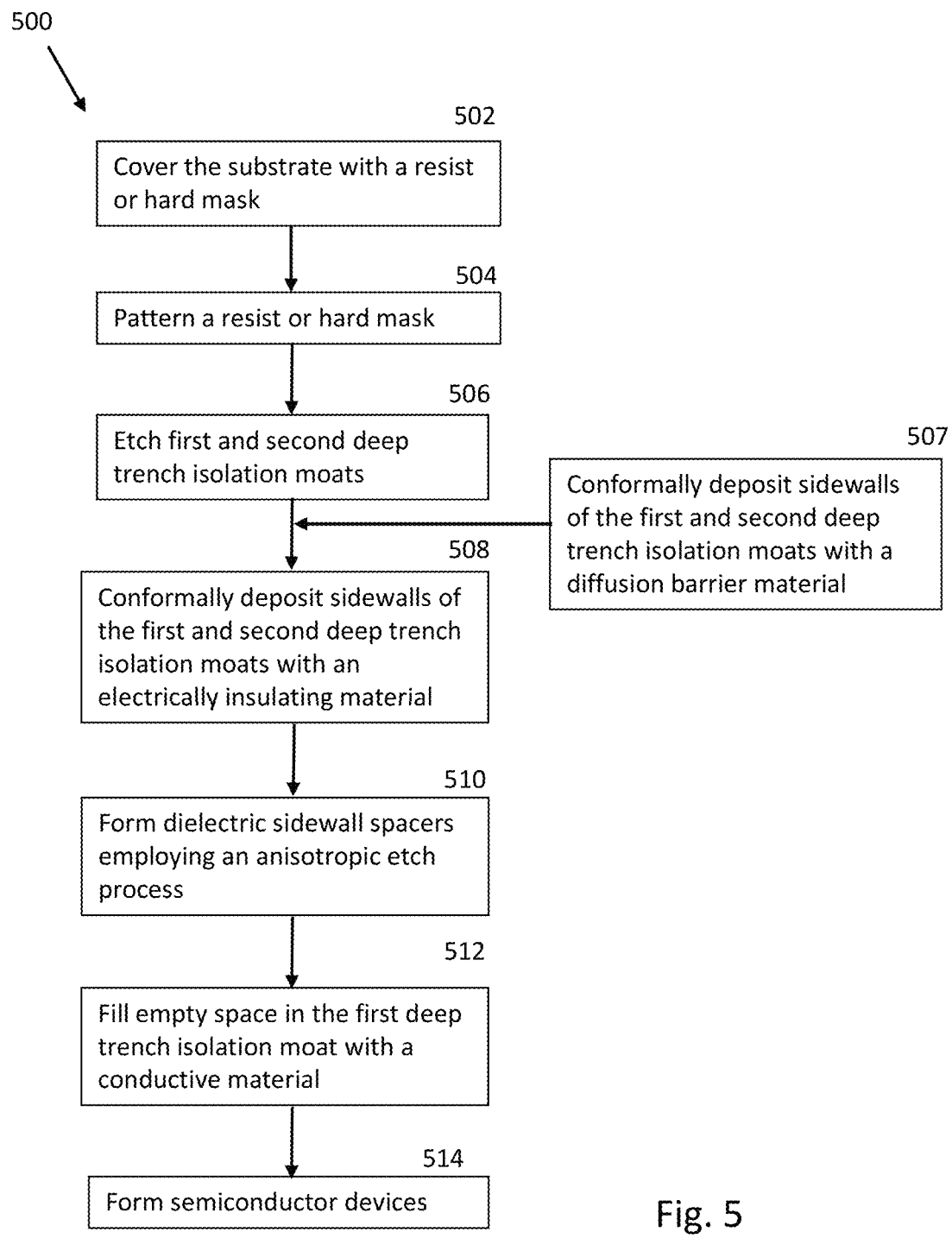
FIG. 5 is a flow diagram of methods of making deep trench isolation structure in accordance with some embodiments.

FIG. 5 is a flow diagram of an embodiment method 500 of making a deep trench isolation structure. FIGS. 6A-6G illustrate sequential vertical cross-sectional views of an exemplary structure during an exemplary manufacturing process using the embodiment method 500.

Figure 6A:
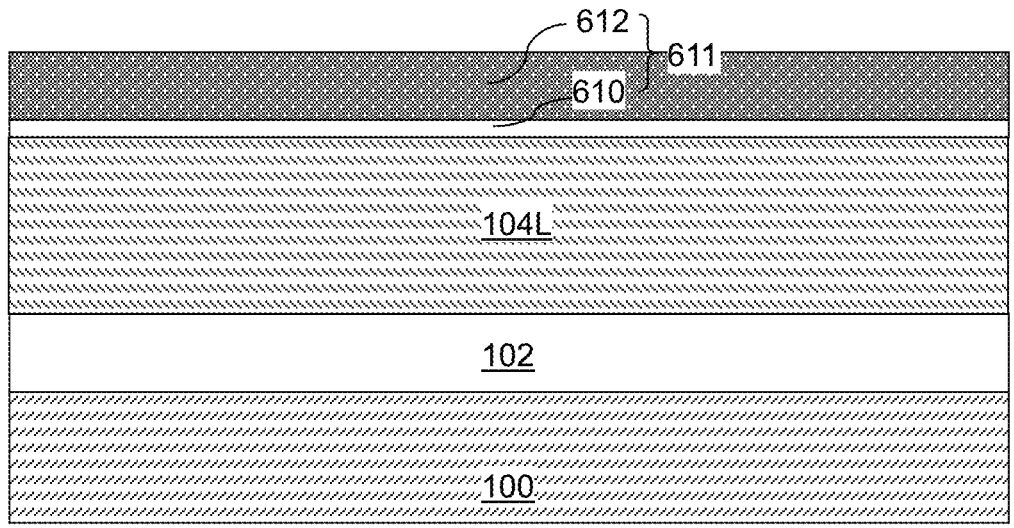
FIGS. 6A-6H are schematic diagrams illustrating methods of making deep trench isolation structure in accordance with some embodiments.

In a first step 502 of the method as illustrated in FIG. 6A, a substrate including a semiconductor device layer 104L may be covered with an etch mask layer 611. The substrate can include a handle substrate 100, a buried insulating layer 102, and the semiconductor device layer 104L. In an embodiment, the etch mask layer 611 may comprise a layer stack including, from bottom to top, a silicon oxide pad layer 610 and a silicon nitride hard mask layer 612. The silicon oxide pad layer 610 can have a thickness in a range from 5 nm to 50 nm, and the silicon nitride hard mask layer 612 can have a thickness in a range from 50 nm to 300 nm, although lesser and greater thicknesses can be used for each. Alternatively, the etch mask layer 611 can include a photoresist layer.

Figure 6B:
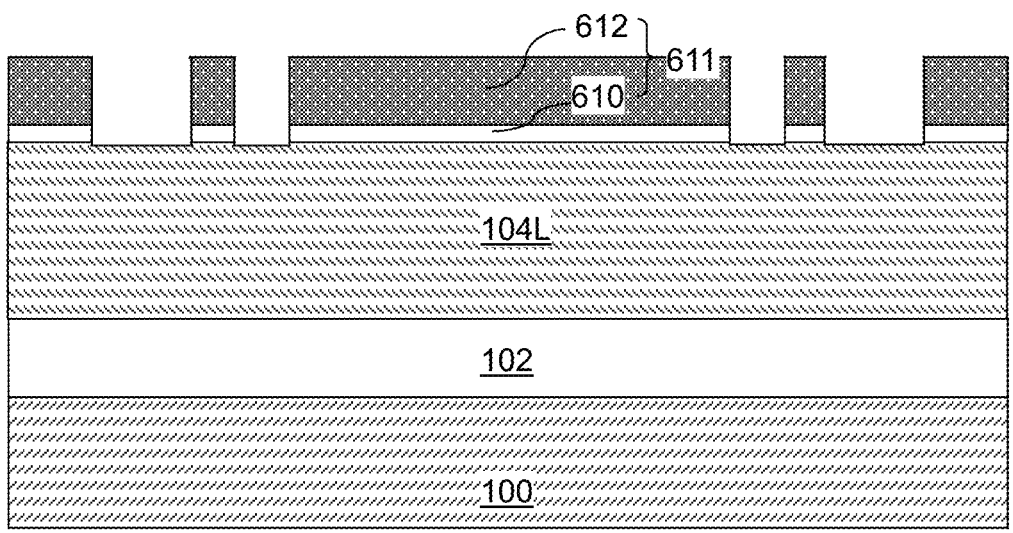
Figure 6C:
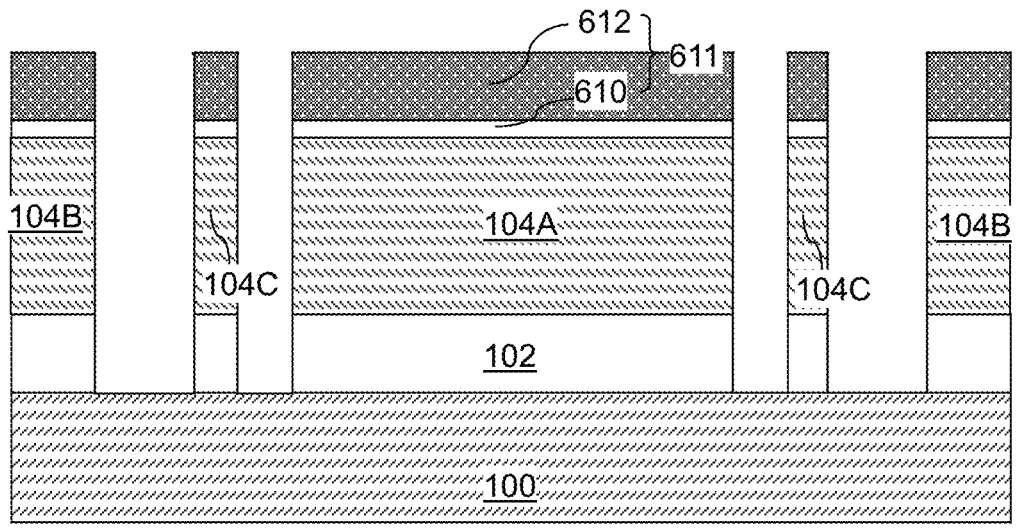

In a second step 504, the etch mask layer 611 can be patterned as illustrated in FIG. 6B. If the etch mask layer 611 includes a stack of the silicon oxide pad layer 610 and a silicon nitride hard mask layer 612, a photoresist layer can be applied over the etch mask layer 611, and can be lithographically patterned to form a pattern of openings having the same pattern as the pattern of the moat trenches (i.e., 106, 108) illustrated in FIGS. 1A, 1B, 2A, and 2B. Unmasked portions of the hard mask layer can be etched by an anisotropic etch process. The photoresist layer can be subsequently removed, for example, by ashing. In embodiments in which the etch mask layer 611 includes a photoresist layer, the etch mask layer 611 can be patterned by lithographic exposure and development.

In a third step 506, the semiconductor device layer 104L and the buried insulator layer 102 may be etched using the patterned etch mask layer 611 as an etch mask. Moat trenches (i.e., 106, 108) including at least the first moat trench and the second moat trench may be formed through the semiconductor device layer 104L and the buried insulating layer 102. The semiconductor device layer 104L may be divided into multiple semiconductor substrate material portions (104A, 104B, 104C) by the anisotropic etch process such as a reactive ion etching process.

Figure 6D:
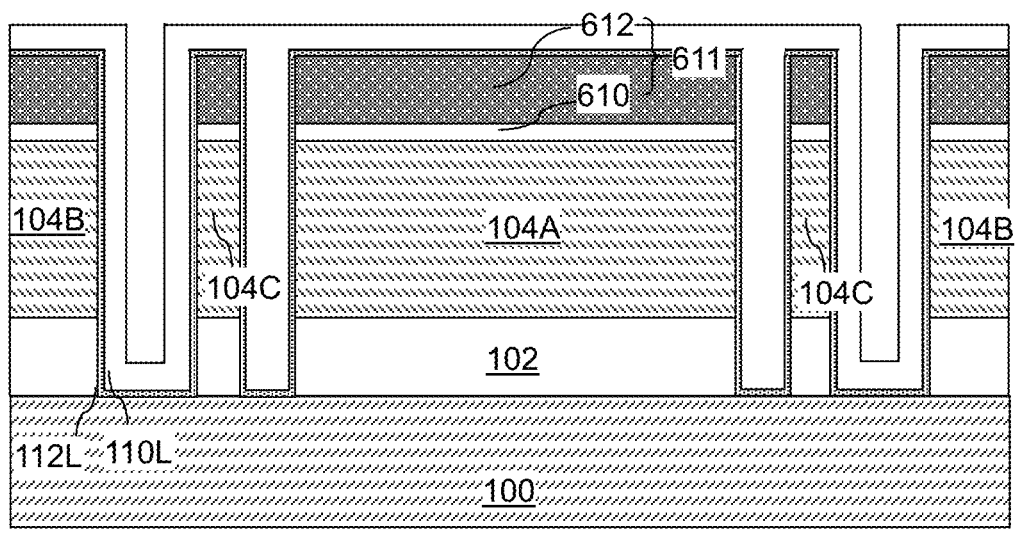

In an optional step 507 illustrated in FIG. 6D, an optional continuous diffusion barrier layer 112L can be deposited using a conformal deposition process. For example, the continuous diffusion barrier layer 112L can be deposited by a low pressure chemical vapor deposition process. The continuous diffusion barrier layer 112L includes a diffusion-blocking dielectric material such as silicon nitride, and can have a thickness in a range from 4 nm to 40 nm, although lesser and greater thicknesses can also be used.

In a fourth step 508, a continuous insulating material layer 110L can be deposited using a conformal deposition process. For example, the continuous insulating material layer 110L can be deposited by a low pressure chemical vapor deposition process. The continuous insulating material layer 110L may fill the entirety of the unfilled volume of the second moat trench 108 and any additional moat trench (i.e. 111), if present, but does not entirely fill the first moat trench 106. The thickness of the continuous insulating material layer 110L in the first moat trench 106 can be in a range from 50 nm to 300 nm, although lesser and greater thicknesses can also be used. The continuous insulating material layer 110L includes an insulating material such as silicon oxide. According to an aspect of the present disclosure, the second moat trench 108 and any additional moat trench (e.g., 111) may be filled with the insulating material of the continuous insulating material layer 110L to form a dielectric moat trench fill structure because the second width w2 of the second moat trench 108 and the width of any additional moat trench (e.g., 111) is equal to, or less than, one half the first width w1 of the first moat trench 106.

Figure 6E:
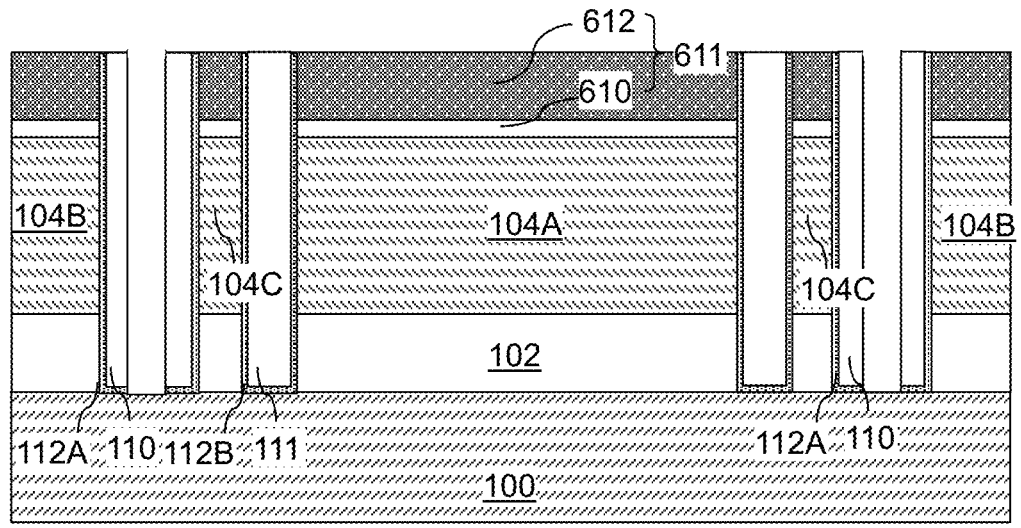

In a fifth step 510 illustrated in FIG. 6E, an anisotropic etch process may be performed to remove horizontal portions of the continuous insulating material layer 110L that overlie the patterned etch mask layer 611 (in embodiments in which the patterned etch mask layer 611 includes a layer stack of the silicon oxide pad layer 610 and the silicon nitride hard mask layer 612). An annular horizontal portion of the continuous insulating material layer 110L located between inner vertically-extending portions of the continuous insulating material layer 110L and outer vertically-extending portions of the continuous insulating material layer 110L may be removed. Further, the anisotropic etch process can remove physically exposed portions of the continuous diffusion barrier layer 112L.

Each remaining portion of the continuous diffusion barrier layer 112L in the first moat trench 106 constitutes a first conformal diffusion barrier layer 112A, and the remaining portion of the continuous diffusion barrier layer 112L in the second moat trench 108 constitutes a second conformal diffusion barrier layer 112B. The first conformal diffusion barrier layers 112A include an inner conformal diffusion barrier layer 112A that contacts sidewalls of the third semiconductor substrate material portion 104C and an outer conformal diffusion barrier layer 112A that contacts sidewalls of the second semiconductor substrate material portion 104B, The second conformal diffusion barrier layer 112B may be formed as a single continuous layer without any opening therethrough, and can contact sidewalls of the first semiconductor substrate material portion 104A, sidewalls of the third semiconductor substrate material portion 104C, and a top surface of the handle substrate 100.

Each remaining portion of the continuous insulating material layer 110L in the first moat trench 106 constitutes a dielectric sidewalls spacer 110, and the remaining portion of the continuous insulating material layer 110L in the second moat trench constitutes a dielectric moat trench fill structure 111. The dielectric sidewall spacers 110 include an inner dielectric sidewall spacer 110a located inside an annular cavity in the first moat trench 106 and an outer dielectric sidewalls spacer 110b located outside the annular cavity in the first moat trench 106. The dielectric moat trench fill structure 111 may be formed as a continuous annular structure. An annular top surface of the handle substrate 100 may be physically exposed at the bottom of the first moat trench 106 between the inner dielectric sidewall spacer 110a and outer dielectric sidewalls spacer 110b.

Figure 6F:
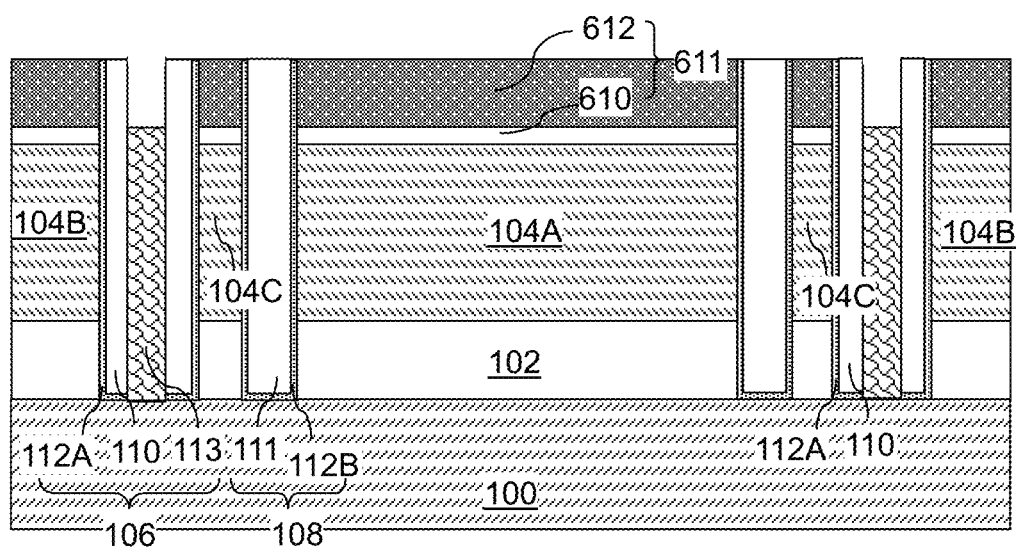

In a sixth step 512 illustrated in FIG. 6F, a conductive moat fill material can be deposited in the annular cavity inside the first moat trench 106 directly on the physically exposed annular surface of the handle substrate 100. In one embodiment, the handle substrate 100 can include a semiconductor material such as single crystalline silicon. The conductive moat fill material may include a doped semiconductor material such as doped polysilicon, or may include at least one metallic material such as a combination of a conductive metallic nitride (such as TiN, TaN, and/or WN) and a conductive metallic fill material (such as tungsten). Other suitable materials within the contemplated scope of disclosure may also be used. Excess portions of the conductive moat fill material can be removed from above the top surface of the patterned etch mask layer 611. A recess etch can be used to vertically recess the conductive moat fill material. An overetch may be performed to vertically recess remaining portions of the conductive moat fill material inside the first moat trench such that the remaining portions of the conductive moat fill material in the first moat trench has an annular top surface located below the topmost surface of the patterned etch mask layer 611 and at, or above, the horizontal plane including the top surface of the first semiconductor substrate material portion 104A. Alternatively, or additionally, a chemical mechanical planarization process may be used to recess the conductive moat fill material. The remaining annular portion of the conductive moat fill material in the first moat trench constitutes a conductive moat fill material portion 113. The conductive moat fill material portion 113 can be topologically homeomorphic to a torus. The set of all material portions in the first moat trench constitutes a first moat trench isolation structure 106, and the set of all material portions in the second moat trench constitutes a second moat trench isolation structure 108.

Figure 6G:
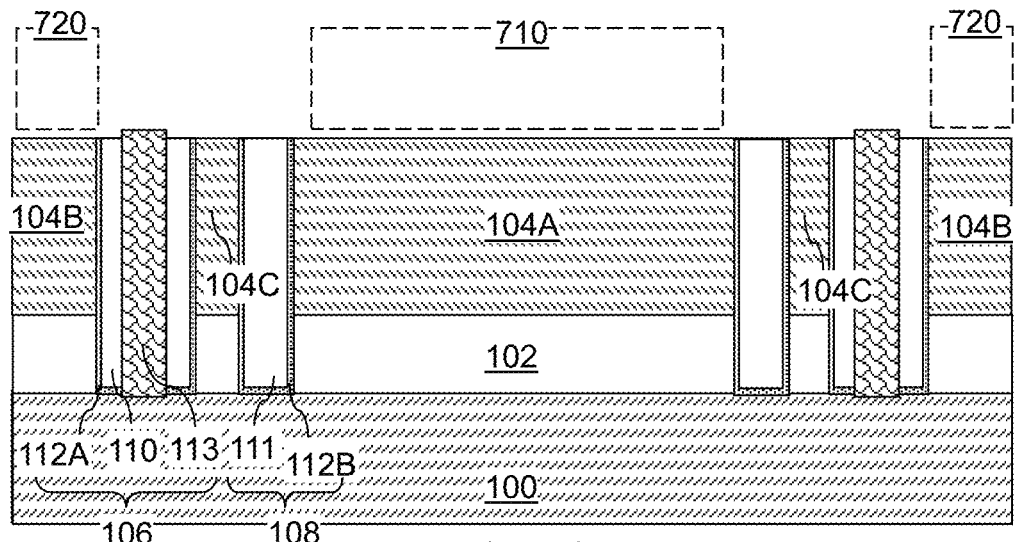

In the next step 514 and referring to FIG. 6G, the patterned etch mask layer 611 can be removed selective to the semiconductor substrate material portions (104A, 104B, 104C) and the moat trench isolation structures (106, 108). For example, the silicon nitride hard mask layer 612 may be removed by a wet etch process using hot phosphoric acid. The silicon oxide pad layer 610 may be removed by a wet etch process using hydrofluoric acid. First semiconductor devices 710 can be formed on, and/or in a portion of, the first semiconductor substrate material portion 104A, and second semiconductor devices 720 can be formed on, and/or in a portion of, the second semiconductor substrate material portion 104B.

Figure 6H:
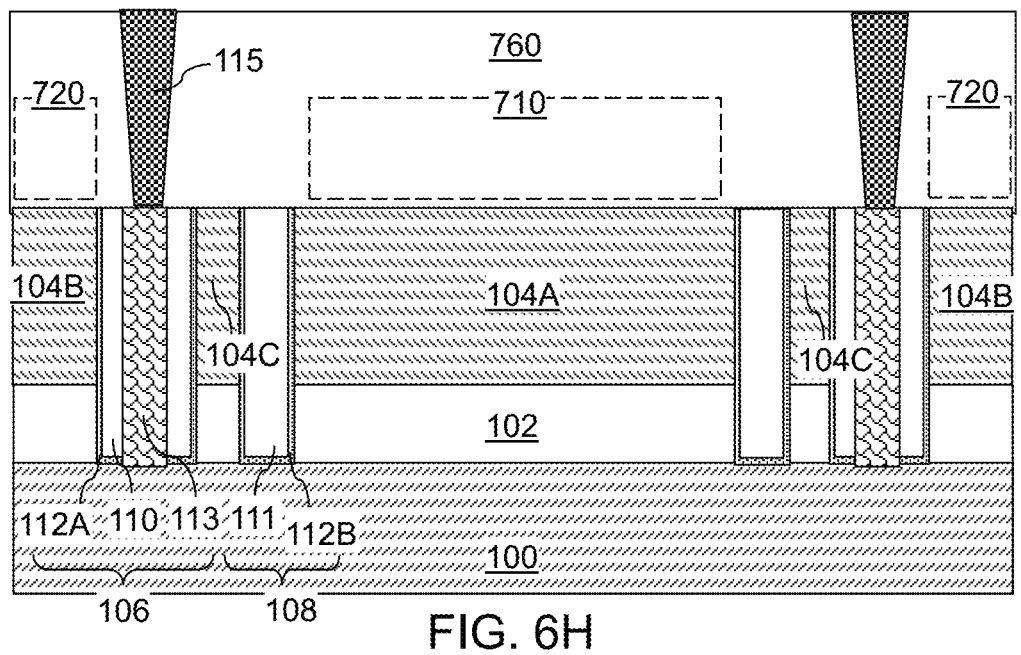

Referring to FIG. 6H, a contact-level dielectric layer 760 can be formed over the first semiconductor devices 710 and the second semiconductor devices 720. The contact via structures 115 can be formed through contact-level dielectric layer 760 directly on the top surface of the conductive moat fill material portion 113 in the first moat trench isolation structure 106. The contact via structures 115 can be used to electrically bias the conductive moat fill material portion 113 and the handle substrate 110 to provide suitable electrical bias, and to electrically isolate the first semiconductor devices 710.

Embodiments of the structures and methods above provide greater electrical isolation between high voltage regions and low voltage regions on the same chip. This allows the integration different types of semiconductor devices on the same chip. By combining the functionality that had previously been on separate chips into a single integrated chip, the number of chips for a given application can be reduced. Consequently, real estate on circuit boards may be freed up as fewer chips may be required. Thus, the cost of assembly may also be lowered.

According to an aspect of the present disclosure, a semiconductor structure may be provided, which comprises: at least a first semiconductor device 710 located on a first semiconductor substrate material portion 104A located in a high voltage region; at a second semiconductor device 720 located on a second substrate material portion 104B located outside the high voltage region; a first moat trench isolation structure 106 electrically insulating the first semiconductor substrate material portion 104A from the second semiconductor substrate material portion 104B; and a second moat trench isolation structure 108 electrically insulating the first semiconductor substrate material portion 104A from the second semiconductor substrate material portion 104B and laterally surrounding the first semiconductor substrate material portion 104A and laterally surrounded by the first moat trench isolation structure 106.

According to another aspect of the present disclosure, a semiconductor structure may be provided, which comprises: at least one first semiconductor device 710 located on a first semiconductor substrate material portion 104A located in a high voltage region; at least one second semiconductor device 720 located on a second semiconductor substrate material portion 104B located in a low voltage region; a set of at least two nested moat trench isolation structures (106, 108) laterally surrounding the high voltage region and electrically insulating the high voltage region from the low voltage region. One of the at least two moat trench isolation structures (106, 108) is filled with at least one dielectric material and another of the at least two moat trench isolation structures (106, 108) comprises an inner dielectric sidewall spacer 110, an outer dielectric sidewall spacer 110, and a conductive moat fill material portion 113 located between the inner dielectric sidewall spacer 110 and the outer dielectric sidewall spacer 110.

According to yet another aspect of the present disclosure, a method of making a semiconductor structure is provided, which comprises: forming a patterned etch mask layer 611 over a semiconductor device layer 104L of a substrate (100, 102, 104L); forming at least two moat trenches in the semiconductor device layer 104L by transferring a pattern in the patterned etch mask layer 611 into the semiconductor device layer 104L using an anisotropic etch process, wherein the at least two moat trenches surrounds a first semiconductor substrate material portion 104A of the semiconductor device layer (104A, 104B, 104C) and is laterally surrounded by a second semiconductor substrate material portion 1094B of the semiconductor device layer (104A, 104B, 104C); forming insulating sidewall spacers 110a, 110b on sidewalls of a first moat trench 106 while filling the second moat trench 108, 118 with the insulating sidewall spacer material; and filling a remaining empty space in the first moat trench 106 with a conductive moat fill material 113.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   at least a first semiconductor device located on a first semiconductor substrate material portion located in a high voltage region;
   at least a second semiconductor device located on a second semiconductor substrate material portion located outside the high voltage region;
   a first moat trench isolation structure electrically insulating the first semiconductor substrate material portion from the second semiconductor substrate material portion; and
   a second moat trench isolation structure electrically insulating the first semiconductor substrate material portion from the second semiconductor substrate material portion and laterally surrounding the first semiconductor substrate material portion and laterally surrounded by the first moat trench isolation structure.

2. The semiconductor structure of claim 1, further comprising a buried insulator layer contacting bottom surfaces of the first semiconductor substrate material portion, the second semiconductor substrate material portion, the first moat trench isolation structure, and the second moat trench isolation structure.

3. The semiconductor structure of claim 2, further comprising a handle substrate underlying the buried insulator layer, wherein the buried insulator layer comprises silicon oxide and has a thickness in a range from 50 nm to 500 nm.

4. The semiconductor structure of claim 1, wherein the first moat trench isolation structure comprises dielectric sidewall spacers and a conductive fill material portion located between the dielectric sidewall spacers.

5. The semiconductor structure of claim 4, further comprising first conformal diffusion barrier layers located between sidewalls of the first moat trench isolation structures and a respective one of the dielectric sidewall spacers.

6. The semiconductor structure of claim 4, wherein the second moat trench isolation structure is filled with at least one dielectric material.

7. The semiconductor structure of claim 6, wherein the second moat trench isolation structure comprises a dielectric moat trench fill structure having a same material composition as the dielectric sidewall spacers and having a lateral thickness that is greater than a lateral thickness of the dielectric sidewall spacers and is less than twice the lateral thickness of the dielectric sidewall spacers.

8. The semiconductor structure of claim 1, wherein:
   the at least first semiconductor device comprises a bipolar-CMOS-DMOS (BCD) device and has an operating voltage in a range from 50 volts to 1,000 volts.

9. A semiconductor structure comprising:
   at least one first semiconductor device located on a first semiconductor substrate material portion located in a high voltage region;
   at least one second semiconductor device located on a second semiconductor substrate material portion located in a low voltage region; and
   a set of at least two nested moat trench isolation structures laterally surrounding the high voltage region and electrically insulating the high voltage region from the low voltage region,
   wherein a first of the at least two moat trench isolation structures is filled with at least one dielectric material and a second of the at least two moat trench isolation structures comprises an inner dielectric sidewall spacer, an outer dielectric sidewall spacer, and a conductive moat fill material portion located between the inner dielectric sidewall spacer and the outer dielectric sidewall spacer.

10. The semiconductor structure of claim 9, wherein the conductive moat fill material portion comprises polysilicon.

11. The semiconductor structure of claim 9, wherein a width of the second of the at least two moat trench isolation structures is at least twice a width of the first of the at least two moat trench isolation structures.

12. The semiconductor device of claim 9, wherein the high voltage region comprises a power region, and the low voltage region comprises a digital region and an analog region.

* * * * *